United States Patent [19]

Leroux et al.

[11] Patent Number: 5,745,009
[45] Date of Patent: Apr. 28, 1998

[54] SEMICONDUCTOR DEVICE INCLUDING A POWER AMPLIFIER AND A MOBILE TELECOMMUNICATION TERMINAL INCLUDING SUCH A SEMICONDUCTOR DEVICE

[75] Inventors: Bruno Leroux, Sucy-en-Brie; Didier Meignant, Emerainville; Eric Puechberty, Paris, all of France

[73] Assignee: U.S. Philips Corporation, New York, N.Y.

[21] Appl. No.: 681,106

[22] Filed: Jul. 22, 1996

[30]     Foreign Application Priority Data

Jul. 21, 1995 [FR] France .................. 95 08894

[51] Int. Cl.⁶ .................................................. H03F 3/193
[52] U.S. Cl. .......................... 330/277; 330/296; 330/297; 330/310; 455/127
[58] Field of Search ..................... 330/277, 296, 330/297, 310; 455/127

[56]      References Cited

U.S. PATENT DOCUMENTS 5,250,912  10/1993  Fujita ..................... 330/277 X
5,392,004   2/1995  Masliah ................... 330/277

FOREIGN PATENT DOCUMENTS 0596562  5/1994  European Pat. Off. .

Primary Examiner—James B. Mullins
Attorney, Agent, or Firm—Arthur G. Schaier

[57]      ABSTRACT

The invention relates to a semiconductor device including an amplifier, and a mobile telecommunication terminal comprising this semiconductor device. The amplifier has a very high frequency a.c. signal and comprises a last stage but one of depletion-layer MESFET transistors (T3) and a last transistor stage (T4) of the same type, coupled by a d.c. isolation capacitor (C4). This capacitor (C4) forms with the intrinsic diode (Δ4) of the transistor (T4) of the last stage a series-arranged rectifier circuit. The latter imposes a shift of the mean level of the a.c. signal on the terminals of said isolation capacitor once the amplitude of the positive part of this a.c. signal has exceeded the conduction threshold of the intrinsic diode (Δ4). This shift of the mean level (−1.5 volts) is used as a negative voltage (−VG) for biasing the coupled gates of all the stages of the amplifier circuit.

12 Claims, 3 Drawing Sheets

SEMICONDUCTOR DEVICE INCLUDING A POWER AMPLIFIER AND A MOBILE TELECOMMUNICATION TERMINAL INCLUDING SUCH A SEMICONDUCTOR DEVICE

FIELD OF THE INVENTION

The invention relates to a semiconductor device including a power amplifier circuit which comprises a plurality of series-arranged depletion-layer field effect transistor stages, among which first stages and a last stage; terminals for a ground, and for the input and output of a high or very high frequency a.c. signal; and bias elements for biasing transistors via the positive voltage on the drains, via a negative voltage on the gates and via the connection of the common sources to the ground terminal.

The invention likewise relates to a mobile telecommunication terminal including such a semiconductor device.

The invention finds its application in the manufacturing of mobile transceivers according to the DECT standard (Digital European Cordless Telecommunication), which is a European standard for cordless digital telephony, according to which the device works at 1.8 GHz while utilizing sequential and time-division multiplexing.

An amplifier circuit is already known from the state of the art from European Patent Application EP 0596 562 A1. This document describes an amplifier circuit which includes two field effect transistor stages connected in series. These stages are fed by a single positive d.c. bias voltage available between a power supply contact and ground. These stages further need to have a negative bias voltage on their gate relative to ground.

According to said document, a powerful VHF (Very High Frequency) signal is applied to the input of the first stage of the amplifier. This powerful signal is formed either by the operating signal of the amplifier circuit, or by an auxiliary signal coming from a generator and having a lower frequency than that of the operating signal, applied in parallel with the latter to the input of the first stage of the amplifier circuit. This first stage is a power stage whose transistor operates in its saturation state. When the stage is supplied with the positive bias voltage and at the same time receives the a.c. power signal on the gate of its field effect transistor, there appears on the gate of this transistor a leakage current which results in a negative gate voltage of the order of −1 volt which is available on the terminals of a large resistor of 10 kΩ inserted between this gate and ground. This negative gate voltage brings this transistor of the input stage of the amplifier circuit to the bias conditions necessary for its operation.

Moreover, the voltage on the terminals of the large gate resistor of the first amplifier circuit stage is derived to bias the gate of the transistor of the second stage placed downstream of the first stage in series.

BACKGROUND OF THE INVENTION

To this day, a technical problem has existed for supplying d.c. current to the semiconductor circuits of small portable systems. In these systems it has now become imperative to utilize only a single positive d.c. bias voltage produced by a cell or by a battery of, for example, +3 volts. The field effect transistors for creating the power amplifier circuits are of the depletion-layer type, that is to say, normally ON when there is no gate-source bias voltage (VGS=0). These transistors need to have a gate bias voltage of between −1 volt and −3 volts for functioning properly. This negative bias voltage for the gate of the depletion-layer transistors is to be generated in the semiconductor device. Generating this negative voltage is a problem, because it supposes the presence of an additional stage in the circuit which asks for a larger circuit surface and additional power consumption; this brings forth highly unwanted consequences with respect to the manufacture of small mobile systems.

Another technical problem exists when the amplifier circuit to be manufactured comprises apart from its input various linear stages, that is to say, it cannot operate in the saturation state because its first stage receives a low-power operating signal of the order of mW. Under these conditions, the solution proposed by the cited document of the state of the art cannot be used without the aid of an auxiliary generator, which is not possible in the scope of the manufacture of small mobile systems.

Such a technical problem exists in the special case where transceivers according to the DECT standard are manufactured. These systems comprise a power amplifier which receives a low-power a.c. operating signal of about 1 mW and is to produce on the output a powerful very high frequency a.c. signal of about 0.5 W. Furthermore, the input and output of this amplifier according to this standard are subjected to a prescribed pattern. It is mandatory that the devices comprising these systems be very light, not very cumbersome and have a very low consumption so as to have the largest possible degree of autonomous operation.

There is another technical problem in the particular case where transceivers according to the DECT standard are manufactured. In effect, there is imposed that the positive d.c. supply voltage arrives at the circuit after the a.c. operating signal. Experiments have shown that these conditions create a problem in the case where an amplifier comprising a larger number of stages than that of cited document is manufactured. This problem consists of the appearance of a current peak in the drain bias circuit of the transistor stages the moment the positive d.c. supply signal arrives at the amplifier circuit. This current peak is destructive and intolerable.

SUMMARY OF THE INVENTION

The present invention proposes an amplifier circuit which has a plurality of stages in a series combination, that is to say, more than 2 stages, to produce a powerful output signal of typically 0.5 W, on the basis of a low-power input signal of typically 1 mW, this amplifier circuit comprising the use of a single external positive bias voltage, and comprising the generation of negative gate bias voltages without the addition of a preliminary power stage or without the addition of an auxiliary generator.

The present invention furthermore proposes such a circuit in which no parasitic current peak exists while the external positive supply voltage is being applied.

The present invention proposes such an amplifier circuit which satisfies the requirements of the DECT standard.

These objects are achieved by a semiconductor device including an amplifier circuit which comprises the elements defined in the opening paragraph, in which amplifier:

the bias elements of said first stages are arranged for producing on the drain of the last one of the first stages a voltage amplified a.c. signal of which the amplitude of its positive component is higher than the conduction threshold of the intrinsic diode of the transistor of the last stage, the transistor of the last stage is isolated from the last one of said first stages by a d.c. isolation capacitor which forms, together with the resistor of the intrinsic diode of the transistor of said last stage, a series-arranged R-C rectifier circuit, which series-arranged rectifier circuit imposes on the terminal of said isolation capacitor common to the gate of the transistor of said last stage a shift of the mean level of the a.c. signal relative to the value of this mean level on the other terminal of said capacitor, said shift being used as a negative voltage available on the terminals of a resistor inserted between the gate of said last transistor and ground.

Such a semiconductor device has, among other things, the advantages of:

not needing an external negative bias voltage;

not needing a specific additional stage for generating the negative bias voltage;

satisfying a requirement of the DECT telecommunication standard according to which the amplifier is to receive a small signal of 1 mW at 0 dB.m with 50 Ω and to produce an amplified power signal of 0.5 W at 27 dB.M with 50 Ω;

satisfying another requirement of the DECT standard according to which the positive d.c. bias voltage is imposed at an instant after the instant at which the a.c. operating signal is imposed on the input terminal of the amplifier circuit;

satisfying in a general manner the requirement of the DECT standard according to which the power of the signals is subjected to a prescribed pattern.

not producing a parasitic current peak while the positive bias voltage is being imposed;

showing minimum consumption and showing in its last power stage a maximum efficiency which is felt the most strongly in the consumption.

BRIEF DESCRIPTION OF THE DRAWINGS

These and other aspects of the invention will be apparent from and elucidated with reference to the embodiments described hereinafter.

In the drawings.

DESCRIPTION OF PREFERRED EMBODIMENTS

Figure 1:
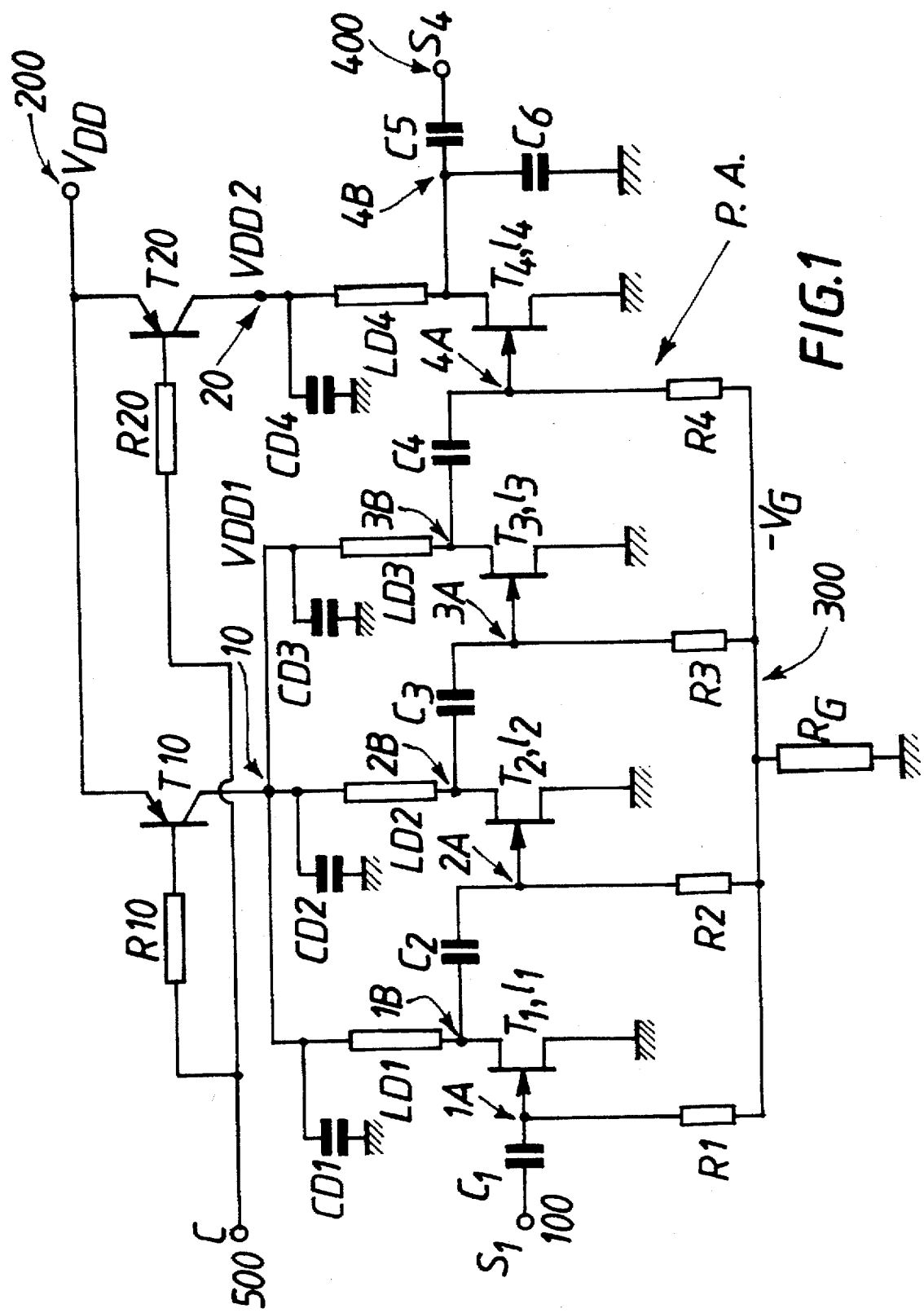
FIG. 1 represents a power amplifier circuit P.A.

With reference to FIG. 1, an amplifier circuit P.A. first has an input 100 for an a.c. signal.

Such a power amplifier circuit P.A. for a mobile device according to the DECT standard receives on its input 100 an a.c. signal S1 in the high-frequency domain or very high-frequency domain typically of 0.9 GHz or 1.8 GHz. This a.c. signal S1 has a small amplitude of 0.7 volt peak-to-peak, imposed by the DECT standard, with 50 Ω, that is, a power level of 0 dB.m on its input 100.

This amplifier circuit comprises, on the one hand, various stages of field effect transistors combined in series, called first stages, and, on the other hand, a final stage of field effect transistors combined in series with the first stages.

This power amplifier is to produce, according to the DECT standard, an output signal S4 on the drain of the last field effect transistor with a power of 27 dB.m, with 50 Ω, that is, 500 mW (0.5 W).

This amplifier circuit further includes a terminal 200 for applying a positive d.c. bias voltage VDD of, for example, +3 volts, and a ground terminal.

Moreover, according to the DECT standard, the power of the signal in the amplifier circuit is to remain in conformity with a prescribed pattern that imposes that the a.c. input signal S1 is applied to the input terminal 100 of the amplifier circuit at an instant prior to the instant at which the positive bias voltage +VDD is applied to the terminal 200.

The amplifier circuit P.A. according to the invention comprises not only means for producing an output signal S4 available on its output terminal 400 which is in conformity with the prescribed pattern of the DECT standard, but this amplifier circuit P.A. also comprises means for generating internally a negative bias voltage necessary for its operation.

With reference to FIG. 1, the amplifier circuit P.A. first comprises, starting from its input 100, at least two and preferably three series-arranged amplifier stages comprising depletion-layer field effect transistors of the Schottky barrier MESFET type. These transistors need a negative gate bias voltage of the order of −1.5 volts to operate.

The last stage is formed in like manner to the first stages.

The first stage of the amplifier circuit comprises a transistor T1 which has a gate width of 11, whose drain 1B is connected to the positive bias terminal VDD via a load LD1, and whose source is connected directly to ground. Its gate receives the a.c. signal S1 at the junction 1A across a capacitor C1 and produces a voltage and power-amplified a.c. signal at the junction 1B on its drain.

The second stage of the amplifier circuit P.A. comprises a transistor T2 which has a gate width of 12, whose drain 2B is connected to the positive bias terminal VDD via a load LD2, and whose source is connected directly to ground. Its gate receives the a.c. signal already amplified at junction 2A across a capacitor C2 and produces an a.c. signal at the junction 2B on its drain, which signal is still voltage and power-amplified.

The third stage of the amplifier circuit comprises a transistor T3 which has a gate width of 13, whose drain 3B is connected to the positive bias terminal VDD via a load LD3, and whose source is connected directly to ground. Its gate receives the a.c. signal amplified by the second stage at junction 3A across a capacitor C3, and produces a still voltage and power-amplified signal at junction 3B.

Each transistor stage is d.c. isolated by a capacitor inserted between the drain of the transistor of the preceding stage and the gate of the transistor of the next stage.

Thus, the capacitors C1, C2, C3, C4 provide d.c. isolation of the first, the second, the third and the fourth stage respectively, the latter also being the last stage in the example of the amplifier circuit shown in FIG. 1.

This fourth stage of the amplifier circuit P.A. comprises a transistor T4 which has a gate width of 14, whose drain 4B is connected to the positive bias terminal VDD via a load LD4, and whose source is connected directly to ground. Its gate receives the a.c. signal amplified by the third stage, at junction 4A, across the capacitor C4.

The transistor T4 of the fourth stage is a power transistor which has a larger gate width 14, because the a.c. signal it receives has already been voltage and power-amplified considerably.

This fourth stage produces on its drain the a.c. output signal S4 at the voltage and power levels imposed by the DECT standard.

The means for internally generating a negative bias voltage VG on the gates of all the MESFET depletion-layer transistors T1 to T4 take into account the existence of an intrinsic gate-source diode symbolized by an arrow on the gates of the transistors represented symbolically in FIG. 1 and utilizes the rectifying function of this diode. In these depletion-layer MESFETs, this gate-source diode has a conduction threshold of the order of 0.7 volt and shows a rectifying function when the positive a.c. voltage applied thereto is higher than this threshold of 0.7 volt.

Figure 2A:
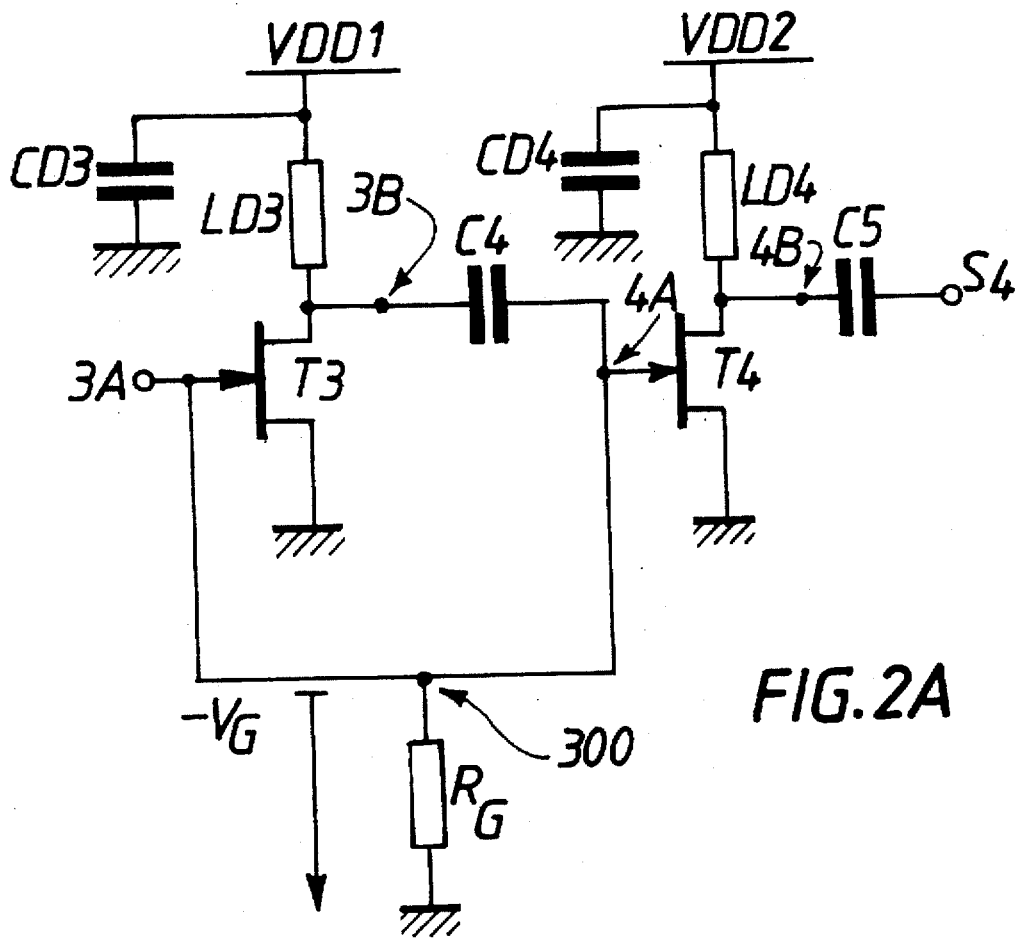
FIG. 2A represents the last stage but one and the last stage of the amplifier circuit P.A.

With reference to FIG. 2A, which separately shows the last-but-one i.e. third and the last i.e. fourth stage of the amplifier circuit P.A. of FIG. 1, there must be taken into account that the amplified a.c. signal now has a peak-to-peak voltage amplitude of the order of 4.4 volts at junction 3B on the drain of transistor T3 while supposing that originally one had the signal S1 on input 100 which had characteristics in conformity with the DECT standard.

At the first instant t0 at which an a.c. signal denoted S3B arrives for the first time at drain 3B of transistor T3, this signal S3B is immediately transmitted to junction 4A across the inter-stage d.c. isolation capacitor C4. At this first instant t0, there is no voltage difference at terminals 3B, 4A of the capacitor C4, and this capacitor C4 is not loaded.

Figure 2B:
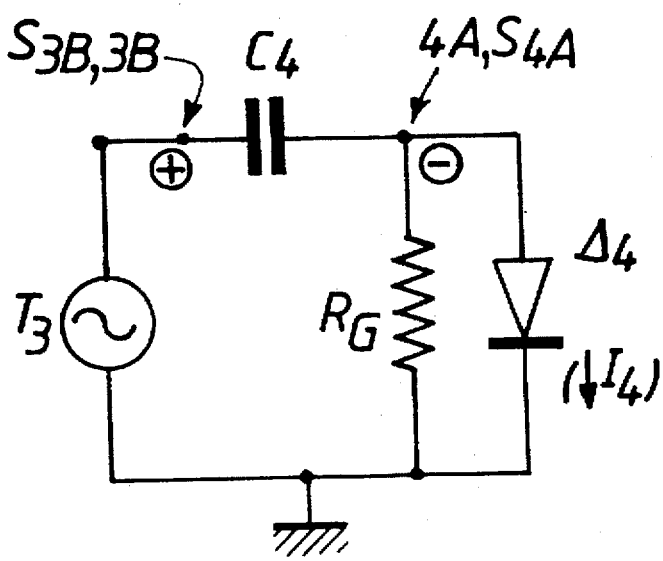
FIG. 2B represents an equivalent circuit diagram of the two stages of FIG. 2A
Figure 2C:
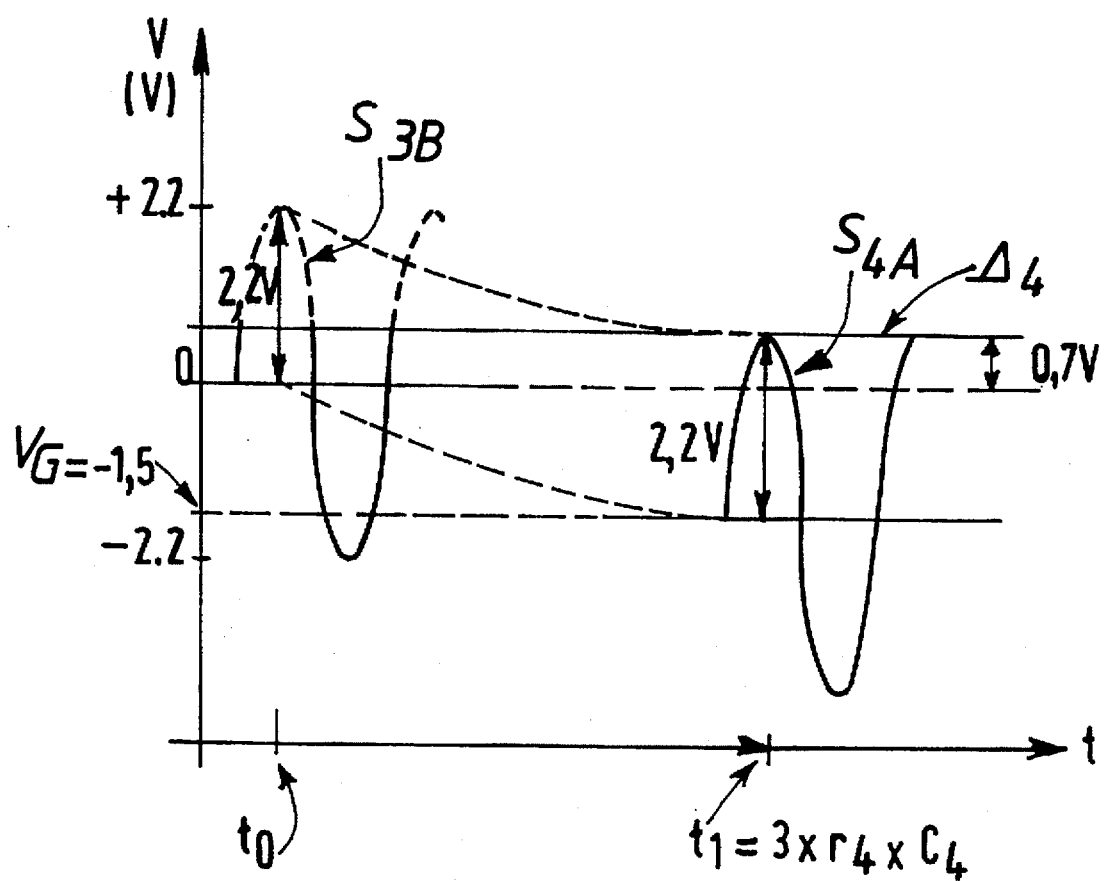
FIG. 2C represents a timing diagram of the evolution of the d.c. and a.c. voltages at junction 4A.

With reference to FIG. 2B which shows an equivalent circuit diagram of these stages, and with reference to FIG. 2C which is a timing diagram representing the evolution of the d.c. and a.c. voltages at junction 4A, on the gate of the transistor of the last stage, this gives:

—the a.c. voltage now denoted S4A present at instant t0 at junction 4A, on the gate of transistor T4, has the same amplitude as the signal S3B, that is to say, peak-to-peak, of the order of 4.4 volts centered at the d.c. level of 0 volts. This amplitude has a positive part of +2.2 volts between the level of 0 volts and the positive peak of the signal, and also a negative part below the level of 0 volts. Only the positive part counts.

—This a.c. voltage S4B of which the positive part is of the order of +2.2 volts is applied to the intrinsic diode A4 of the last transistor T4. The positive part of this a.c. voltage has an amplitude that exceeds the threshold voltage of the diode Δ4, this threshold voltage being of the order of 0.7 volt. Thus this a.c. signal is truncated.

—Under these conditions, the diode Δ4 becomes conductive and the result is a current I4 which is established by ground in the circuit formed by the two last transistor stages T3 and T4. This current I4 is not only created by the positive part of the a.c. signal that exceeds the threshold of 0.7 volt.

With reference to the equivalent circuit diagram of FIG. 2B, the transistor T3 is symbolized by a voltage generator, and the transistor T4 is symbolized by its intrinsic diode Δ4.

Once the instant t0 at which the a.c. signal S4A arrives at junction 4A has occurred, the diode Δ4 becomes conductive, the isolation capacitor C4 starts to be loaded and a voltage difference appears on its terminals between the junctions 3B and 4A. This voltage difference is only due to the voltage of the a.c. signal and not to the biasing of the drain of the transistor T4, because C4 prevents the propagation of the d.c. drain bias voltage.

Only the amplitude of the a.c. signal counts, because only the a.c. signal can propagate across C4.

These loading conditions of the capacitor C4 are transitory conditions which tend to lower the highest level of +2.2 volts of the peak of the a.c. signal at junction 4A and thus to lower its mean level which was 0 volts at instant t0. The peak-to-peak amplitude of the signal is unchanged. Only its mean level is lowered.

These transient loading conditions of the capacitor are maintained until the diode Δ4 is no longer conductive and thus until the load current I4 no longer exists. The capacitor C4 is now fully loaded at this new instant t1. As a diode Δ4 is no longer conductive and the current I4 has become zero again, the state of the circuit is thus called stationary.

The stationary state generally appears at an instant t1 separated from the initial instant t0 by a time delay $$t1-t0=3\tau=3\times r4\times C4$$

where $\tau$ is the time constant of the system formed by the capacitor C4 and by the resistance r4 in the diode Δ4. These values are of the order of:

$r4 \cong 0.1 \ \Omega$ $C4 \cong 10 \ pF$ $3 \ \tau \cong 3.10^{-12}$ sec.

The transient state is thus very brief. The R-C circuit formed by the resistor of the intrinsic diode Δ4 and by the inter-stage isolation capacitor C4 is called series rectifying circuit.

With reference to the timing diagram of FIG. 2C, at instant t1 in the stationary state, the positive peak of the a.c. signal at the junction 4A no longer exceeds the conduction threshold of 0.7 volt of the diode Δ4. The signal is no longer truncated. The a.c. signal S4A has a peak-to-peak amplitude of 4.4 volts just like the a.c. signal S3B at the junction 3B, but its mean level is shifted and is now positioned at −1.5 volts, exactly so that the positive peak of +2.2 volts of the signal is positioned between this −1.5 volts level and the +0.7 volt level of the conduction threshold of the diode Δ4.

In the stationary state, which appears from instant t1 onwards, the mean voltage level at the junction 4A on the gate of the transistor T4 is −1.5 volts, so that the positive peak does not exceed the 0.7 volt level which would be produced by the conducting diode Δ4; the voltage difference on the terminals of the capacitor C4 is −1.5 volts with the polarities indicated in FIG. 2B.

First this negative voltage level is extremely favourable for biasing the gate of the last transistor T4.

Then, as shown in the equivalent circuit diagram of FIG. 2B, this mean level constitutes a d.c. voltage difference present on the terminals of a high-value resistor RG inserted between the junction 4A on the gate of the transistor T4 and ground, while the negative value −VG is present on this gate.

In the circuit diagram of the last two stages of transistors T3 and T4 of FIG. 2A, this resistor RG is inserted between the gate junction 4A of the last transistor T4 and ground, and the gate 3A of the last transistor but one T3 is connected to the gate of the last transistor for also being supplied with this negative voltage −VG of the order of −1.5 volts.

With reference to FIG. 1, preferably small resistors R1, R2, R3, R4 are used between the respective gates 1A, 2A, 3A and 4A and the common termination 300 of the high-value resistor RG. By suitably choosing the small resistors, a person skilled in the art can control the consumption of each stage to minimize this consumption.

In fact, this amplifier circuit P.A. intended for a portable system is to consume the least possible power, so that the cell or battery of the portable system has the longest possible useful life.

Hereinbelow, values of active and passive elements will be given by way of example, which makes it possible to manufacture the amplifier circuit P.A. in the form of an integrated semiconductor circuit, the substrate for manufacturing this circuit being gallium arsenide, which is a favourable material for integrating high frequency and very high frequency circuits. The chip formed by the integrated circuit on this substrate is disposed on a substrate or base.

l1=0.2 mm l2=0.6 mm l3=2 mm l4=7 mm
R1=1 kΩ R2=1 kΩ R3=500 Ω R4=1.2 kΩ

In these 4 transistor stages, the gate widths of the transistors preferably increase from T1 to T4, the transistor loads are self inductances realized, for example, by the connection wires between the chip formed by the gallium arsenide substrate and the contact studs or other connections realized on the substrate. For a better stability of the amplifier it is further desirable to separately decouple each of the drains of the transistors relative to ground via the respective capacitors CD1, CD2, CD3, CD4. Also preferably, but not mandatory, the last transistor stage, which is the fourth stage in the example of FIG. 1, operates in the saturation state. It will be noted that it is not a characteristic feature that induces the negative gate voltage, but the means described above. When the last stage operates in the saturation state it is simply possible to improve the efficiency of the amplifier (it will be recalled that the efficiency appears from the formulation of the difference between the a.c. output power and the a.c. input power divided by the d.c. power).

In the amplifier circuit as described above with reference to FIG. 1, simply because, on the one hand, according to the DECT standard the d.c. power supply VDD is imposed by a control system C after the a.c. signal S1 has arrived at junction 100 and, on the other hand, because all the gates of the transistors are connected, a current peak of the order of 2A may appear the moment this positive d.c. supply voltage VDD is applied, whereas the d.c. current is typically to be of the order of 500 mA.

According to the invention, the solution to this problem is provided by the switching circuit formed by two transistors T10 and T20 of the MOS PNP type, arranged in parallel and each having a resistor on their base, R10 and R20, respectively. The bases of these transistors are controlled at the same instant by the control signal C applied to terminal 500. The d.c. voltage VDD of about +3 volts is applied to the emitters of these transistors T10 and T20.

The collector of the transistor T10 distributes at junction 10 the drain bias voltage of the 3 first stages of the amplifier circuit P.A.; the collector of transistor T20 distributes at junction 20 the drain bias voltage of the last transistor stage of this amplifier circuit.

By selecting different and suitable resistances for R10 and R20, for example
R20=500 Ω
R10=1 kΩ,
the current peak is suppressed.

In fact, the moment the supply voltage VDD is applied to the amplifier under the control of C, only the input stage of the amplifier circuit already receives the a.c. signal; the gates of the other stages still have a zero voltage; applying the positive supply voltage to the short-circuit transistors causes a saturation current IDSS to appear on the drains. If all the drains of all the stages are fed via the same d.c. distribution line, the impedance corresponding to all the grouped transistors is large and the resulting saturation drain current is very large, of the order of 2A, shown by a current peak lasting several microseconds on the distribution line.

According to the invention, the distribution lines are now decorrelated, that is to say, VDD1 for the first stages and VDD2 for the last stage, and are fed by two separate networks R10, T10 and R20, T20, respectively. The result is that the current peak corresponding to the saturation drain current for the 3 grouped first stages is of the order of 100 mA; and the corresponding current peak for the last stage is of the order of 400 mA.

The switching network for the supply voltage VDD thus resolves this problem of current peak in the case where all the stages are connected by their gates in the manner described above suitable for generating the internal negative gate voltage.

Figure 3:
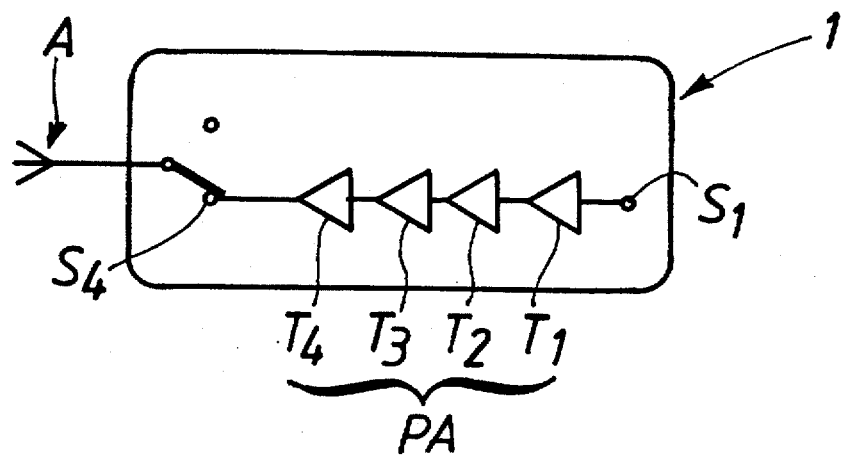
FIG. 3 represents a mobile telecommunication system including an amplifier circuit as shown in FIG. 1.

With reference to FIG. 3, the integrated amplifier circuit P.A. and its power supply switching network are included in a portable cordless telecommunication terminal 1, comprising other integrated circuits which are not described here and an aerial A. This device makes it possible to receive and transmit.

This type of mobile device is particularly suitable for either or not professional residential applications. This type of mobile telephone assumes the existence of a base station which manages the use of various mobile telephones by various separate users.

We claim:

1. A semiconductor device including a power amplifier circuit which comprises:

a plurality of series-arranged depletion-layer field effect transistor stages, among which first stages and a last stage;

terminals for a positive bias voltage, for ground, and for the input and output of a high or very high frequency a.c. signal, bias elements for biasing transistors via the positive voltage on the drains, via a negative voltage on the gates and via the connection of the common sources to the ground terminal, wherein the bias elements of said first stages are arranged for producing on the drain of the last one of the first stages a voltage amplified a.c. signal of which the amplitude of its positive component is higher than the conduction threshold of the intrinsic diode of the transistor of the last stage, the transistor of the last stage is isolated from the last one of said first stages by a d.c. isolation capacitor which forms, together with the resistor of the intrinsic diode of the transistor of said last stage, a series-arranged R-C rectifier circuit, which series-arranged rectifier circuit imposes on the terminal of said isolation capacitor common to the gate of the transistor of said last stage a shift of the mean level of the a.c. signal relative to the value of this mean level on the other terminal of said capacitor, said shift being used as a negative voltage which is available on the terminals of a resistor inserted between the gate of said last transistor and ground for biasing the gate of at least said transistor of said last stage.

2. The device as claimed in claim 1, in which all the gates of the transistors of the stages preceding the last stage are connected to the gate of the transistor of the last stage, said negative voltage being used as a bias voltage of said gates.

3. The device as claimed in claim 2 in which a resistor is inserted between each gate of the respective transistors of all the stages and their connection point.

4. The device as claimed in claim 3, in which the number of first stages is three and the last stage is the fourth stage.

5. The device as claimed in claim 4 further including a switching network for switching the positive bias voltage, which comprises two transistor stages controlled by the same control signal and each including a load for separately feeding a first positive bias voltage distribution line for said first stages and a second positive bias voltage distribution line for said last stage.

6. The device as claimed in claim 5 in which the transistors of the switching networks are of the MOS PNP type, the control signal is simultaneously applied to their base through said loads formed by resistors, the positive bias voltage is applied to their emitters and their collectors are connected to the first and second distribution line, respectively.

7. The device as claimed in claim 1, in which the number of first stages is three and the last stage is the fourth stage.

8. The device as claimed in claim 1, further including a switching network for switching the positive bias voltage, which comprises two transistor stages, controlled by the same control signal and fed by a load for separately feeding a first positive bias voltage distribution line for said first stages, and a second positive bias voltage distribution line for said last stage.

9. A mobile telecommunication terminal comprising a semiconductor device including a power amplifier circuit which comprises:

a plurality of series-arranged depletion-layer field effect transistor stages, among which first stages and a last stage;

terminals for a positive bias voltage, for ground, and for the input and output of a high or very high frequency a.c. signal, bias elements for biasing transistors via the positive voltage on the drains, via a negative voltage on the gates and via the connection of the common sources to the ground terminal, wherein the bias elements of said first stages are arranged for producing on the drain of the last one of the first stages a voltage amplified a.c. signal of which the amplitude of its positive component is higher than the conduction threshold of the intrinsic diode of the transistor of the last stage, the transistor of the last stage is isolated from the last one of said first stages by a d.c. isolation capacitor which forms, together with the resistor of the intrinsic diode of the transistor of said last stage, a series-arranged R-C rectifier circuit, which series-arranged rectifier circuit imposes on the terminal of said isolation capacitor common to the gate of the transistor of said last stage a shift of the mean level of the a.c. signal relative to the value of this mean level on the other terminal of said capacitor, said shift being used as a negative voltage which is available on the terminals of a resistor inserted between the gate of said last transistor and ground for biasing the gate of at least said transistor of said last stage.

10. The mobile telecommunication terminal as claimed in claim 9, further including a switching network for switching the positive bias voltage, which comprises two transistor stages controlled by the same control signal and fed by a load for separately feeding a first positive bias voltage distribution line for said first stages, and a second positive bias voltage distribution line for said last stage.

11. A power amplifier circuit for use in a semiconductor device, said power amplifier circuit comprising:

a plurality of series-arranged depletion-layer field effect transistor stages, each of said stages including at least one transistor;

means for biasing each of said transistors in said plurality of series-arranged stages;

means for each of said stages to receive a high or very high frequency a.c. signal and means for each of said stages to output a high or very high frequency a.c. signal;

means for producing, on the drain of a transistor in a stage immediately preceding a transistor in a subsequent stage in said series, a voltage amplified a.c. signal of which the amplitude of its positive component is higher than the conduction threshold of the intrinsic diode of the transistor in the subsequent stage; and wherein the transistor in the subsequent stage is isolated from the transistor in the preceding stage by a d.c. isolation capacitor which forms, together with the resistor of the intrinsic diode of the transistor in the subsequent stage, a series-arranged R-C rectifier circuit which imposes on the terminal of said isolation capacitor common to the gate of the transistor in the subsequent stage a shift of the mean level of the a.c. signal relative to the value of this mean level on the other terminal of said capacitor, said shift being used as a negative voltage which is available on the terminals of a resistor inserted between the gate of said transistor in said subsequent stage and ground for biasing the gate of said transistor of said subsequent stage.

12. A mobile telecommunication terminal comprising a semiconductor device including a power amplifier as claimed in claim 11.

* * * * *